(12) United States Patent
Friend et al.

(10) Patent No.: US 12,500,581 B2
(45) Date of Patent: Dec. 16, 2025

(54) MULTI-PHASE CLOCK GENERATION CIRCUIT WITH DIGITAL CALIBRATION

(71) Applicant: INTERNATIONAL BUSINESS MACHINES CORPORATION, Armonk, NY (US)

(72) Inventors: David M. Friend, Stewartville, MN (US); Daniel Mark Dreps, Georgetown, TX (US); Dereje Yilma, Rochester, MN (US); Glen A. Wiedemeier, Austin, TX (US); Yang You, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 18/345,046

(22) Filed: Jun. 30, 2023

(65) Prior Publication Data

US 2025/0007498 A1 Jan. 2, 2025

(51) Int. Cl.
*H03K 3/356* (2006.01)
*H03K 5/1252* (2006.01)
*H03K 5/24* (2006.01)

(52) U.S. Cl.
CPC ..... *H03K 3/356104* (2013.01); *H03K 5/1252* (2013.01); *H03K 5/24* (2013.01)

(58) Field of Classification Search
CPC ... H03K 3/356104; H03K 5/1252; H03K 5/24
See application file for complete search history.

(56) References Cited

U.S. PATENT DOCUMENTS

| | | | |
|---|---|---|---|
| 8,854,102 B2 | 10/2014 | Chaivipas | |
| 10,382,023 B1 | 8/2019 | Lu | |
| 10,396,807 B1 | 8/2019 | Dai | |
| 10,476,434 B1 | 11/2019 | Pandita | |
| 2011/0273210 A1* | 11/2011 | Nagaraj | H03L 7/104 327/159 |

(Continued)

FOREIGN PATENT DOCUMENTS

| | | | |
|---|---|---|---|
| KR | 101418045 | * | 7/2014 |
| WO | 2014187373 A1 | | 11/2014 |
| WO | 2015050865 A1 | | 4/2015 |

OTHER PUBLICATIONS

A Compact, Low-Power and Low-Jitter Dual-Loop Injection Locked PLL Using All-Digital PVT Calibration Ahmed Musa et al. IEEE Journal of Solid-State Circuits, vol. 49, No. 1, Jan. 2014 (Year: 2014).*

(Continued)

*Primary Examiner* — Lincoln D Donovan
*Assistant Examiner* — James G Yeaman
(74) *Attorney, Agent, or Firm* — Onyx IP Group (57) ABSTRACT

A power saving improvement in an injection locked oscillator (ILO) used is described. The ILO circuitry comprises a feedback path to provide a finecal (M-bit fine calibration signal). The feedback path need not be active at all times; only when an event occurs that requires the feedback path to update the value of the finecal signal. A monitor is provided to sense the occurrence of such event which may be, for examples, an end of a time period or a predetermined change in temperature. When the event occurs, the feedback path is activated to update the value of the finecal signal.

16 Claims, 6 Drawing Sheets

(56) References Cited

U.S. PATENT DOCUMENTS

2022/0244755 A1   8/2022  Wang

OTHER PUBLICATIONS

IEEE Journal of Solid-State Circuits, vol. 49, No. 1, Jan. 2014 (Year: 2014) (Year: 2014).*

G. Anzalone, E. Monaco, G. Albasini, S. Erba and A. Mazzanti, "A 0.2-11.7GHz, high accuracy injection-locking multi-phase generation with mixed analog/digital calibration loops in 28nm FDSOI CMOS," ESSCIRC Conference 2016: 42nd European Solid-State Circuits Conference, Lausanne, Switzerland, 2016, pp. 335-338, doi: 10.1109/ESSCIRC.2016.7598310.

* cited by examiner

MULTI-PHASE CLOCK GENERATION CIRCUIT WITH DIGITAL CALIBRATION

BACKGROUND

Modern off chip bandwidth requirements have steadily increased, forcing more and more advanced techniques to transmit data reliably.

SUMMARY

Modern off chip bandwidth requirements have steadily increased, forcing more and more advanced techniques to transmit data reliably. For example, at data rates of 2 GHZ (gigahertz) and above the "eyes" (periods of time in which data may be reliably sampled) become more and more narrow as frequency increases. It is important to sample incoming data in or near the center of the "eyes".

Modern techniques use PLLs (phase locked loops) or ILOs (injection locked oscillators) for accurate frequency and phase control. ILOs are particularly used where a single ILO design must handle a range of frequencies, for example, for different chips operating at different frequencies. ILOs typically receive a "coarse setting" to define what the frequency of a reference clock input to the ILO is. This is typically an N-bit input (e.g., seven bits) to set a nominal frequency of the ILO. ILOs also typically receive a "fine calibration" input, typically an M-bit input (e.g., four bits "encoded" or an unencoded sixteen bits) generated within a HSIO (high speed input/output) system within which the ILO is built.

Described herein is a high speed input/output system having an ILO. The ILO receives a coarse tuning for the general frequency and a fine calibration. The fine calibration is a digital signal that may need be be changed based on a change in temperature, voltage, or a timeout of a timer.

DETAILED DESCRIPTION

The present disclosure deals with a method to control a fine calibration input to an injection locked oscillator (ILO).

Figure 1:
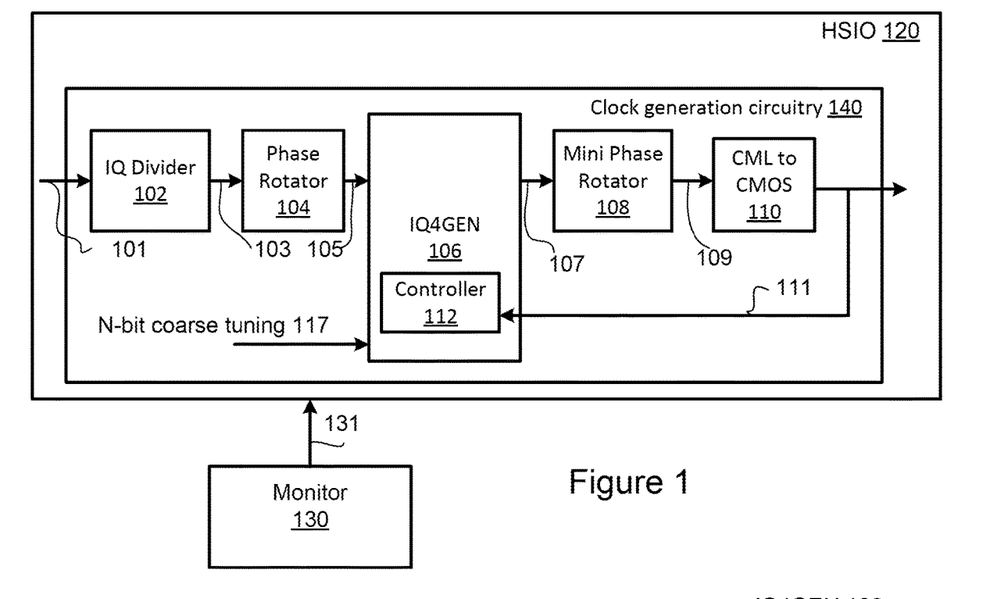
FIG. 1 shows a block diagram of high speed input output (HSIO) system which contains an injection locked oscillator (ILO) with blocks to support the ILO and a monitor.

Turning now to FIG. 1, a high-speed input output block and explanation of the blocks are given.

HSIO 120 is a high-speed input output block shown, in part, to identify key parts of a clock generation portion of HSIO 120.

Clock generation circuitry 140 comprises IQ Divider 102, phase rotator 104, IQ4GEN 106 which further comprises controller 112, mini phase rotator 108, and CML to CMOS 110.

Monitor 130 is used to signal 131 to drivers and receivers that M-bit fine calibration 207 is going to be recalibrated.

Recalibration of M-bit fine calibration 207 would cause significant jitter in the clock output, so during the fine calibration time, the drivers and receivers are "retrained" and are not using clocks generated in clock generation circuitry 140. Generally, recalibration needs to be done because of temperature or voltage changes, which also would affect the driver and receiver circuitry. This will be described in more detail later.

IQ divider 102 receives a single clock phase on signal 101 as input and outputs two clock phases 90 degrees apart, at half the input clock frequency on signal 103. This is well-known in the art and will not be discussed further herein.

Phase rotator 104 takes, from signal 103, two clock phases 90 degrees apart and mixes them according to a digital input code to produce a single output phase at the same frequency but arbitrary phase on signal 105. Ideally the phase varies linearly with the digital input code. In a high-speed serial link, the phase rotator is used to align a sampling clock with a center of a data eye and obtain the lowest bit error rate, as well as track clock variation using CDR (clock data recovery). This is well-known in the art and will not be further discussed herein.

Figure 2:
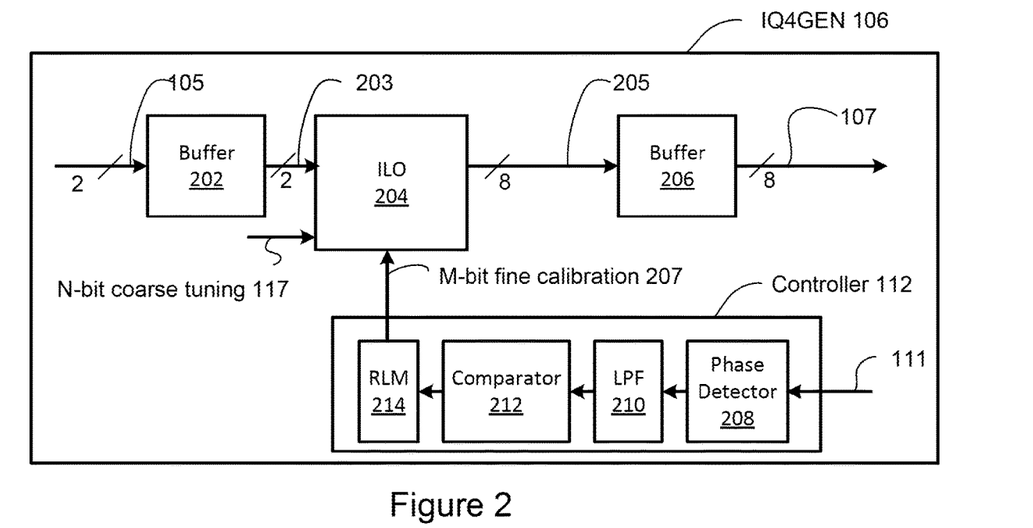
FIG. 2 shows a high-level diagram of the ILO and supporting blocks.

IQ4GEN 106 is described in more detail in FIG. 2.

Mini phase rotator 108 is generally the same as main phase rotator 104 except outputs are 45 degrees apart, so there are two input phases on signal 107 and there is one output phase on signal 109. The range of the output phase is less than that of the outputs of phase rotator 104. Mini phase rotator 108 is used to compensate for clock skew. There are four of these in an embodiment of the current invention, so at the output of four mini phase rotators 108, four clock phases are available.

CML to CMOS 110 converts the low swing differential signals on signal 109 in the preceding circuits to full rail-to-rail CMOS levels on signal 111 which is used in data sampling latches in receivers (not shown) in HSIO 120. Signal 111 is also sent to controller 112 as a feedback loop.

With reference now to FIG. 2, signal 105 is buffered by buffer 202 to signal 203 which is input to injection locked oscillator ILO 204. ILO 204 outputs signal 205 to buffer 206, which drives signal 107.

Controller 112 has phase detector 208 which receives signal 111 from CML to CMOS 110. Outputs of phase detector 208 are low pass filtered in LPF 210 and fed to comparator 212, which outputs a "1" or "0" signal to random logic macro RLM 214. RLM 214 produces the M-bit fine calibration 207 signal, for brevity, hereinafter referred to as finecal 207.

Figure 3:
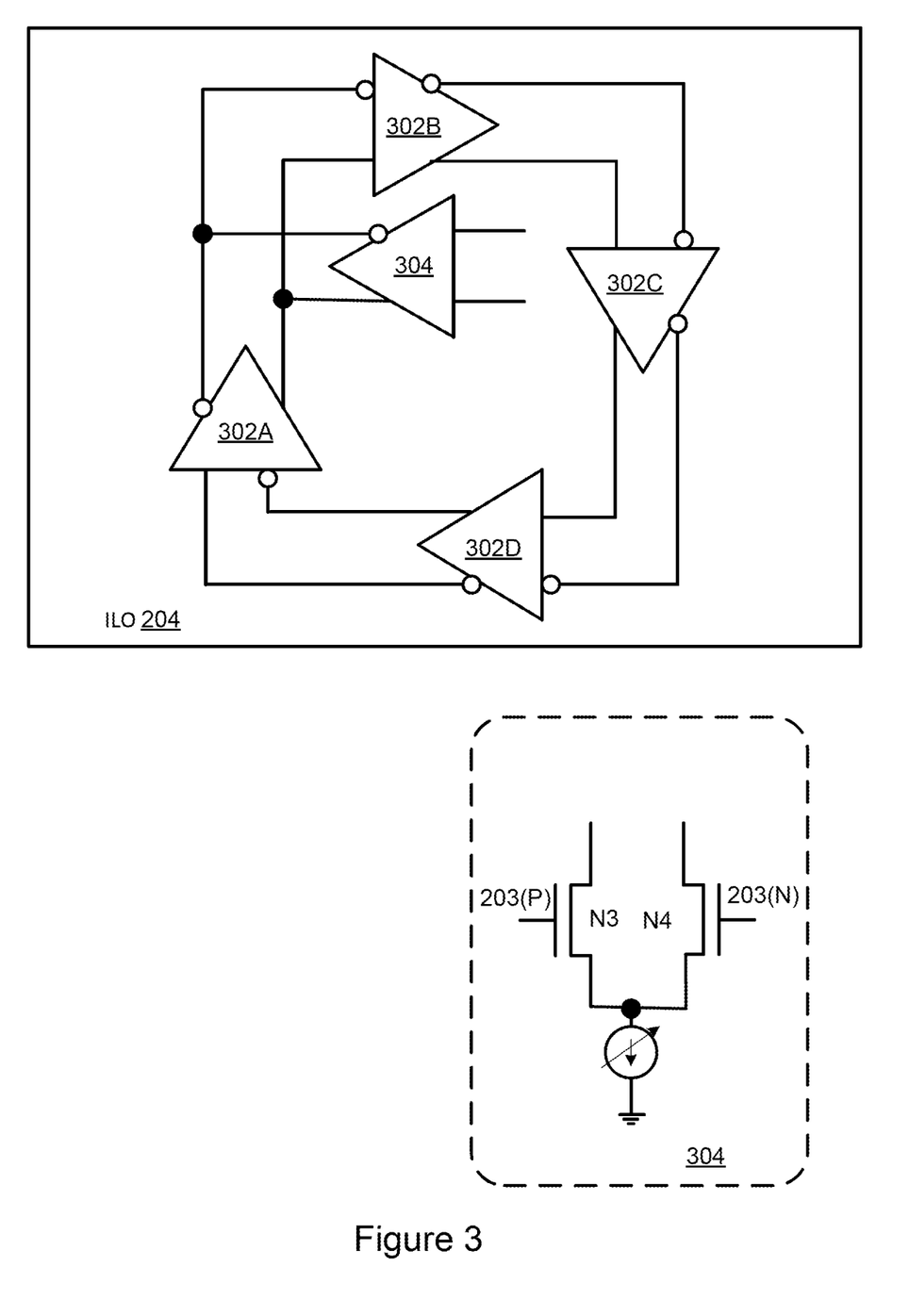
FIG. 3 shows a diagram of the ILO, showing four differential blocks connected in a ring, with a block connected to inject current into one stage of the ring. The differential blocks and the injector block are shown in more detail under the ring connection.

With reference now to FIG. 3, ILO 204 is shown to be a ring oscillator comprising four differential blocks 302 (302A, 302B, 302C, and 302D) connected as an oscillating ring. Circles indicate "negative" for inputs and outputs. For example, a negative output of 302A is coupled to a negative input of 302B, and so on until 302D's negative output is coupled to a positive input of 302A. Injection locking is done by block 304 with receiving 203(P) positive input and 203(N) negative input. N3 and N4 are a differential stage. Outputs from block 304 are connected to outputs of block 302A as shown.

Figure 6:
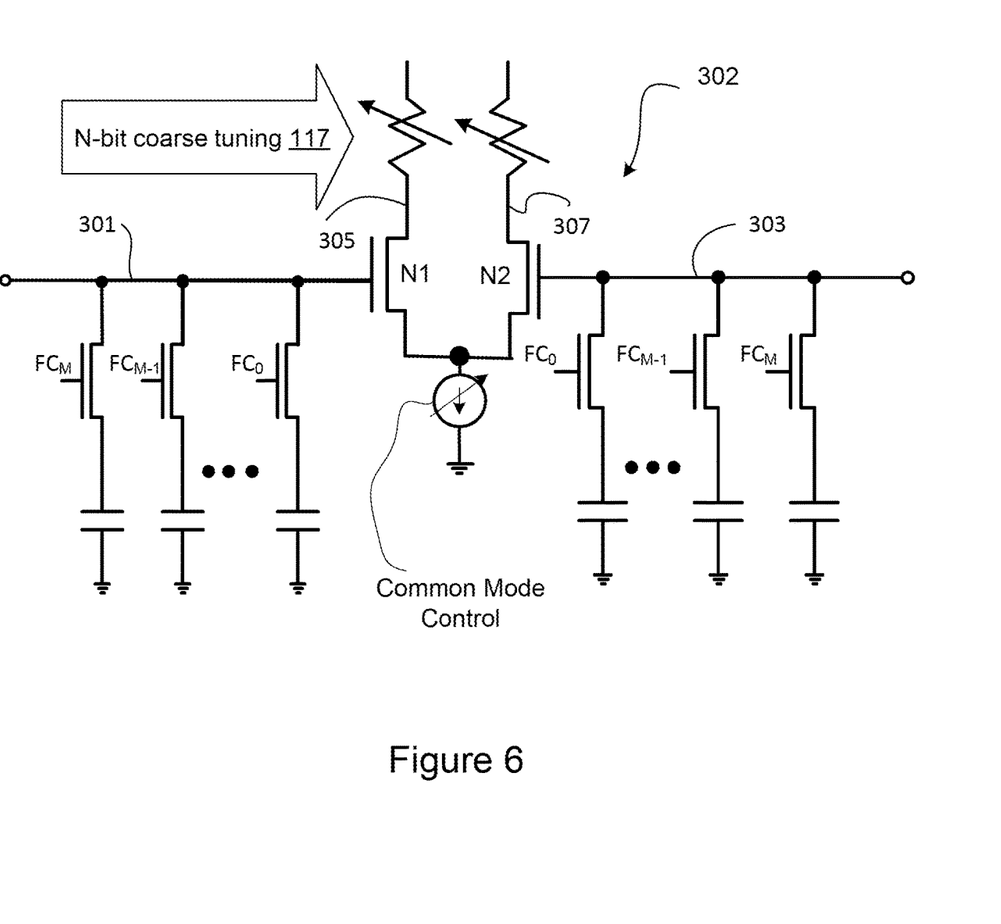
FIG. 6 is a detailed ring oscillator block.

A detailed description of block 302A is shown in FIG. 6.

With reference now to FIG. 6, details of a block 302 are shown. Drains of N1 and N2 are coupled to resistors controlled by N-bit coarse tuning 117, which sets the ILOs nominal frequency. The nominal frequency may be changed for different applications by changing the value of N-bit coarse tuning 117. The tail current of the differential 302 is set by conventional means to control common mode output voltage on the block 302 outputs 305 and 307.

Gates of N1 and N2 FETs (N-channel field effect transistors are assumed to be the FETs used herein) are connected to the previous ring stage's outputs a particular 302 has input signals 301 and 303. Fine tuning is done using finecal 207. Bits of finecal 207 are labeled $FC_0$ to $FC_M$. A particular "1" bit in finecal 207 will turn the FET it is coupled to on both inputs to block 302 and cause the signal to be slowed down. If all M bits of finecal 207 are "1" the ILO will oscillate as slowly as possible, given the current coarse tuning 117 value.

Inputs to block 302 are signals 301 and 303. Outputs are signals 305 and 307.

Figure 4:
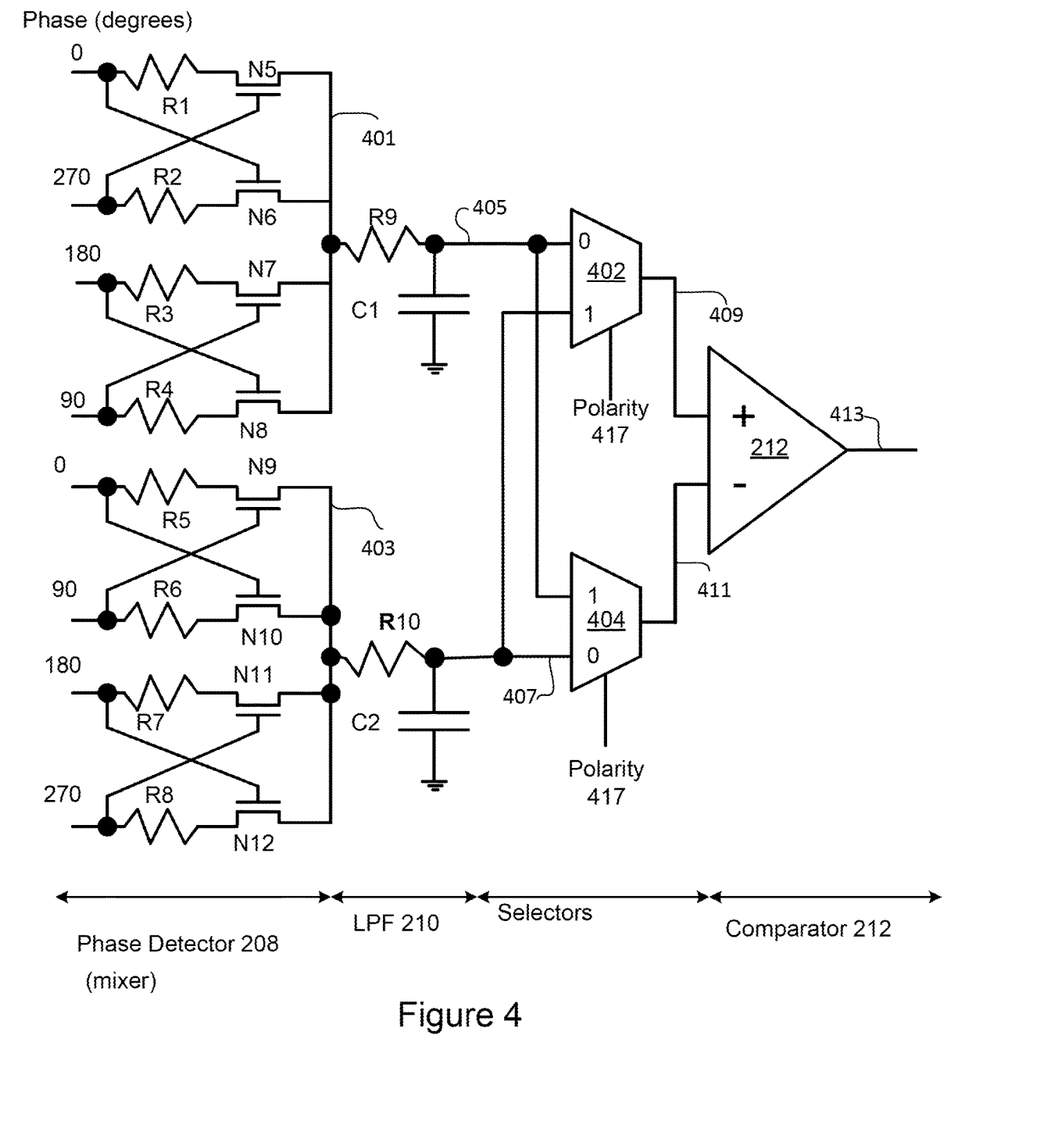
FIG. 4 shows a phase detector (mixer), a LPF (Low Pass Filter), and selectors feeding a comparator used to determine if the fine calibration needs to be changed.

FIG. 4 gives a circuit schematic of phase detector 208, LPF 210, and comparator 212. Phase detector 208 has a mixer comprised of resistors R1, R2, R3, R4, R5, R6, R7, and R8; FETs (Field Effect Transistors) N5, N6, N7, N8, N9, N10, N11, and N12 coupled to inputs from the four bits of signal 111 as shown. Phase 0 is coupled to a R1 and N5 series connection, with N5 coupled to phase 270. Likewise, phase 270 is coupled to a R2 and N6 series connection with N6 driven by phase 0. Similar connections occur for phases 180 and 90. R3, R4, N7, and N8. N5, N6, N7, and N8 have terminals coupled to signal 401, which is input to low pass filter made up of R9 and C1 and outputs to signal 405. Likewise, phases 0, 90, 180, and 270 produce an on signal 403 which is input low pass filter made up of R10 and C2. Output of the R10 and C2 low pass filter is signal 407. Selector 402 receives signals 405 and 407 and passes signal 407 if polarity is 1 and 405 if polarity is 0. Selector 404 passes signal 405 if polarity is 1 and passes 407 if polarity 417 is 0. Signal 409 from selector 402 is coupled to a positive input of comparator 212; signal 411 of selector 404 is coupled to a negative input of comparator 212. Comparator 212 drives signal 413 to RLM 214.

Figure 5:
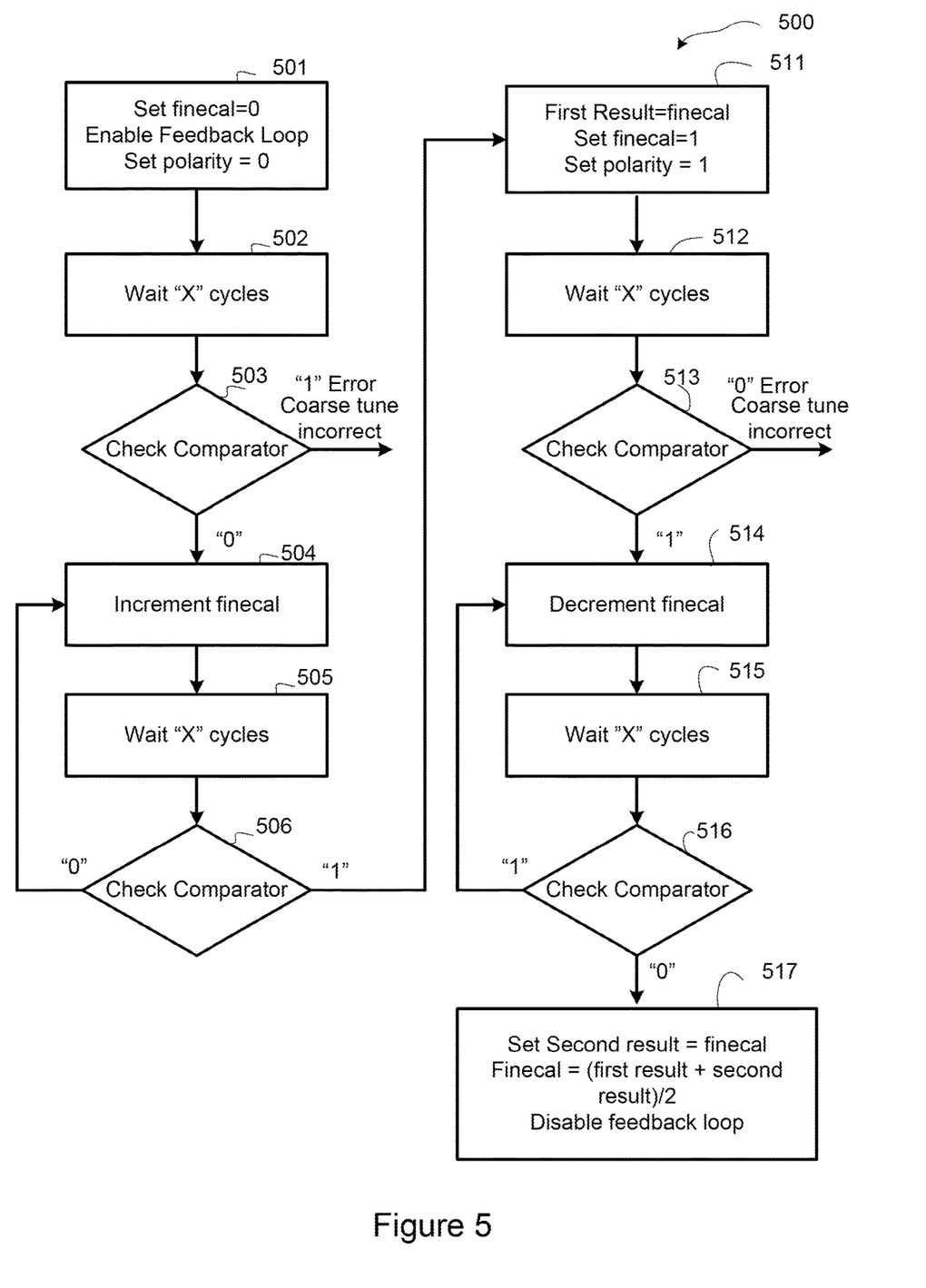
FIG. 5 shows a flow diagram used to properly set the fine calibration.

The purpose of polarity 417 is to account for possible mismatch in the FET differential pair in comparator 212, as will be shown in FIG. 5.

FIG. 5 illustrates a method 500 performed by RLM 214. RLM 214 may be embodied with software or with random logic blocks.

In block 501, finecal 207 is set to "0" (all M bits set to 0). Feedback loop controller 112 is activated. Polarity 417 is set to 0.

In block 502, wait "X" cycles where "X" is set by a designer to allow time for effect of the value change in finecal 207 to reach a steady state.

In block 503, comparator (signal 413) is checked. If "1" an error in coarse tuning exists; if "0" control passes to block 504.

In block 504, finecal 207 is incremented.

In block 505, wait "X" cycles.

In block 506, the comparator signal 413 is checked. If the comparator signal 413 is still "0", control passes back to block 504. If comparator signal 413 is "1", control passes to block 511.

In block 511, the finecal 207 value is stored as "first result" in latches. then finecal 207 is set to "1" (all bits in finecal 207 set to "1").

In block 512, wait "X" cycles.

In block 513, comparator signal 413 is checked. If "0", an error in coarse fine tuning exists. If "1", control passes to block 514.

In block 514, finecal is decremented.

In block 515, wait "X" cycles.

In block 516 check comparator signal 413. If "1", pass control to block 514. If "0", pass control to block 517.

In block 517, set "second result" to finecal 207. Final value for finecal 207=(first result+second result)/2. This minimizes effect of any FET mismatch in the differential pair in the comparator 212. Then feedback loop is turned off to save power (shut off phase detector 208, comparator 212, and logic in RLM 214 except for latches outputting finecal M-bit fine calibration 207).

The feedback loop and attendant power is not needed until M-bit fine calibration 207 needs to be updated. The ILO may be running at 10 gigahertz or more, which is ten cycles per nanosecond. Changing the M-bit fine calibration may be needed if there is some change in, for example, temperature, voltage, bit error rate or other factor. At that time, a calibration period is started upon a signal from monitor 130. Receivers are put into a mode where they do not use an output from clock generation circuitry 140 during the calibration period.

Besides power reduction from turning off the feedback loop, controller 112, inherently, since no changes are made to finecal 207 while the receivers are using the clock generation circuitry output signal 111, jitter is reduced and a faster phase response is obtained.

Figure 7A:
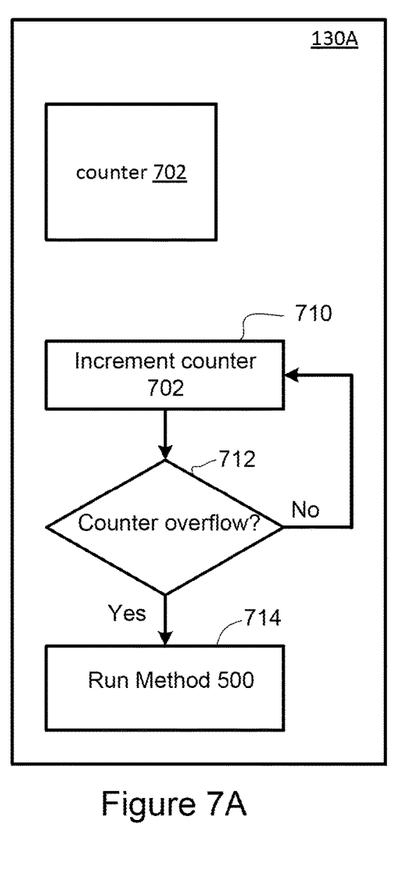
FIGS. 7A and 7B show two exemplary monitors that can start a recalibration.

FIG. 7A shows a simple embodiment of monitor 130. A counter 702 counts at a user defined frequency.

In block 710, counter 702 is incremented.

In block 712, a check has been made to see if the counter has overfowed. If "No", control returns to block 710. If "Yes", the user determined time (e.g. 10 milliseconds) which the user has determined or estimated is much shorter than a thermal time constant. Control passes to block 714 which runs method 500.

The monitor 130A may be running more calibrations than necessary as the user's estimate on frequency of updating finecal 207 is pessimistic.

Figure 7B:
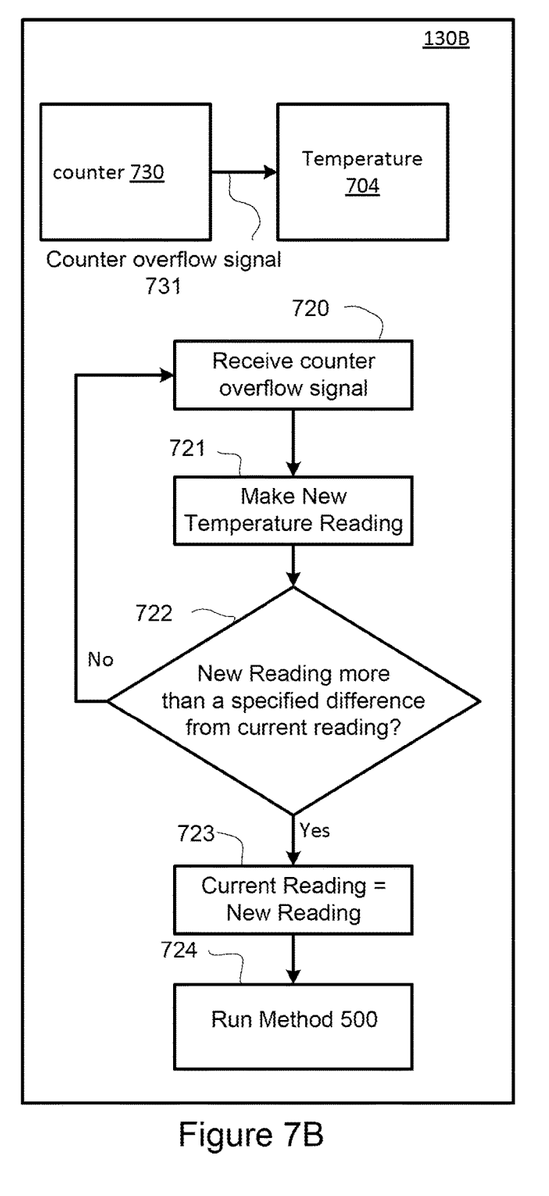

FIG. 130B shows a more complicated monitor 130 that will only respond to thermal variations large enough to warrant a recalibration.

Here, a counter 730, perhaps running at a faster rate than the counter 702 of 130A, receives a temperature signal from temperature 704 upon overflow of counter 730. Counter overflow signal 731 requests a new temperature reading from temperature 704.

In block 720, receive counter overflow signal.

In block 721, make new temperature reading.

In block 722, is the new reading more than a specified difference from a current reading? If yes, pass control to block 723 which sets current reading equal to the new reading, then block 724 runs method 500 to update finecal 207. If no, control passes back to block 720.

What is claimed is:

1. A clock generation circuit comprising:
   an output at CMOS (complementary metal oxide semiconductor) levels to high-speed receivers;
   an injection locked oscillator (ILO) further comprising a coarse tuning input directly in the ILO and an M-bit fine calibration (finecal) signal input to the ILO; and a feedback path from the output to provide the finecal signal having a controller, the controller being turned off until an event turns it on,
wherein the controller includes a random logic module (RLM).

2. The clock generation circuit of claim 1, further comprising a monitor to detect the event.

3. The clock generation circuit of claim 2, wherein the event is an end of a predetermined period of time.

4. The clock generation circuit of claim 2, wherein the event is a detection of a predetermined change in temperature.

5. A method to set a finecal (M-bit fine calibration) signal in an injection locked oscillator (ILO) comprising:
setting all bits in finecal to 0;
enabling a feedback loop in the ILO;
setting a polarity signal to 0, the polarity signal used in circuitry to mitigate effects of FET (field effect transistors) mismatch in a comparator;
waiting "X" cycles, where "X" is a user-defined value to let the ILO adapt to the new finecal value;
checking the comparator, if "1" a coarse tuning error has occurred and the method ends;
if the comparator is "0", incrementing finecal by increasing the number of "1" bits in the M-bit fine calibration signal by one and waiting "X" cycles until comparator is "1";
storing the current value of finecal as a first result;
setting finecal to "1" by making all bits in the M-bit fine calibration signal "1";
setting the polarity signal to "1";
waiting "X" cycles;
checking comparator, if "0" there is an error in the coarse tuning signal and the method ends;
if comparator is "1", decrementing finecal (changing a bit in finecal from "1" to "0") until comparator is "0";
setting a second result equal to the current value of finecal;
setting finecal equal to (first result+second result)/2; and
disabling the feedback loop.

6. A method of reducing jitter and improving phase response in a clock generation system having an injection locked oscillator (ILO) which uses an N-bit coarse tuning directly in the ILO and an M-bit fine calibration signal, the method comprising:
turning on a feedback loop in the clock generation system during a calibration period in which receiver circuitry is not using an output of the ILO,
wherein the clock generation system includes a controller includes a random logic module (RLM);
determining a correct value for the M-bit fine calibration signal; and
turning off the feedback loop in the clock generation system until a monitor causes another calibration time.

7. The method of claim 6, jitter being inherently reduced by absence of changes in the M-bit fine calibration signal while the feedback loop is turned off.

8. The method of claim 6, phase response being inherently improved by absence of changes in the M-bit fine calibration signal while the feedback loop is turned off.

9. The method of claim 6, including saving power when the feedback loop is turned off.

10. The clock generation circuit of claim 1, wherein the controller is provided in the feedback path from the output to provide the finecal signal.

11. The clock generation circuit of claim 10, wherein the controller in the feedback path from the output to provide the finecal signal further comprises a low pass filter.

12. The clock generation circuit of claim 11, wherein the controller in the feedback path from the output to provide the finecal signal further comprises a phase detector.

13. The clock generation circuit of claim 12, wherein the controller in the feedback path from the output to provide the finecal signal further comprises a comparator positioned between the low pass filter and the RLM.

14. The method of claim 6, wherein the controller further includes a low pass filter.

15. The method of claim 14, wherein the controller further includes a phase detector.

16. The method of claim 15, wherein the controller includes a comparator positioned between the low pass filter and the RLM.

* * * * *